United States Patent [19]

Kikuda et al.

[11] Patent Number: 4,879,679

[45] Date of Patent: Nov. 7, 1989

[54] DYNAMIC RANDOM ACCESS MEMORY HAVING STORAGE GATE ELECTRODE GROUNDING MEANS

[75] Inventors: Shigeru Kikuda; Hiroshi Miyamoto, both of Hyogo, Japan

[73] Assignee: Mitsubishi Denki Kabushiki Kaisha, Tokyo, Japan

[21] Appl. No.: 163,017

[22] Filed: Mar. 2, 1988

[30] Foreign Application Priority Data

Jun. 11, 1987 [JP] Japan ................................ 62-147251

[51] Int. Cl.$^4$ ...................... G11C 11/24; G11C 11/34; H01L 29/78; H03K 3/01
[52] U.S. Cl. ..................................... 365/149; 365/182; 365/226; 357/23.1; 307/15; 307/296.6
[58] Field of Search ................ 365/149, 182, 226, 228; 357/23.6; 307/296.2, 15

[56] References Cited

U.S. PATENT DOCUMENTS

| | | | |
|---|---|---|---|
| 4,497,043 | 1/1985 | Tizuka et al. | 365/182 |
| 4,535,423 | 8/1985 | Nozaki et al. | 365/149 |
| 4,641,165 | 2/1987 | Tizuka et al. | 365/149 |
| 4,672,584 | 6/1987 | Tsuji et al. | 365/226 |
| 4,691,304 | 9/1987 | Hori et al. | 365/226 |
| 4,791,610 | 12/1988 | Takemae | 365/149 |
| 4,798,974 | 1/1989 | Reczek et al. | 357/23.6 |

FOREIGN PATENT DOCUMENTS 0186773 9/1986 European Pat. Off. .
61-25318 2/1986 Japan .

OTHER PUBLICATIONS

IEDM 85: "Static and Transient Latch-up Hardness in N-Well CMOS With On-Chip Substrate Bias Generator", by D. Takacs et al., 18.5, 1985, pp. 504–508.

Primary Examiner—Stuart N. Hecker
Assistant Examiner—Melissa J. Koval
Attorney, Agent, or Firm—Lowe, Price, Le Blanc, Becker & Shur

[57] ABSTRACT

A dynamic RAM provided on a semiconductor substrate comprises: a memory cell including a capacitor for storing electric charges as information, the capacitor having a storage gate electrode to which a potential other than a ground potential is applied during normal operation of the dynamic RAM; a peripheral circuit including a CMOS circuit; and grounding means for applying the ground potential to the storage gate electrode only in a predetermined period immediately after a start of application of a power supply voltage to the dynamic RAM.

5 Claims, 5 Drawing Sheets

DYNAMIC RANDOM ACCESS MEMORY HAVING STORAGE GATE ELECTRODE GROUNDING MEANS

BACKGROUND OF THE INVENTION

1. Field of the Invention

The present invention relates to a dynamic random access memory (hereinafter referred to as dynamic RAM) and particularly to a prevention of latch-up in a dynamic RAM including a peripheral circuit having a CMOS circuit.

2. Description of the Prior Art

FIG. 1 is a schematic sectional view showing a portion of a conventional dynamic RAM including a peripheral circuit having by a CMOS circuit (hereinafter referred to as CMOS DRAM).

A memory cell 1 of an nMOS type comprises a capacitor C3 for storing electric charges as data, the capacitor C3 having a storage gate electrode 2. The storage gate electrode 2 is connected to a Vcc/2 generating circuit 3 having a high impedance to decrease electric energy consumption of the CMOS-DRAM. A peripheral circuit 4 of a CMOS type, to which a power supply voltage Vcc is applied, is formed on a p-substrate 5, where the memory cell 1 is also formed, and on an n-well 22.

In addition, a voltage between the storage gate electrode 2 and the substrate 5 is lowered as a result of decrease of a voltage applied to the storage gate electrode 2 to a half of the power supply voltage Vcc and, accordingly, a thickness of an insulating film (not shown) of the capacitor C3 of the memory cell 1 can be made small without causing any damage thereto. Consequently, even if an area of the memory cell 1 is reduced, the capacitor C3 of the memory cell 1 has a large capacitance and large-scale integration can be attained with such CMOS DRAM.

In the above described CMOS DRAM, it is important to prevent latch-up in a parasitic thyristor (e.g., a pnpn structure formed by a p+ region 21, an n-well 22, the p-substrate 5 and an n+ region 23 shown in FIG. 1) existing in the peripheral circuit 4. Therefore, occurrence of latch-up during operation in the CMOS DRAM of FIG. 1 is prevented in the below described manner, thereby to avoid damage in the memory cell 1 and the peripheral circuit 4.

When the power supply voltage Vcc is applied to the peripheral circuit 4 to bring the CMOS DRAM into an enabled state, a negative voltage V1 is applied from a substrate voltage generating circuit (not shown) to the substrate 5. As a result, rise of the substrate voltage $V_{BB}$ is suppressed and transition to an on-state in the pnpn structure is prevented, whereby occurrence of latch-up can be avoided.

However, in this CMOS DRAM, the negative voltage V1 applied from the substrate voltage generating circuit to the substrate 5 is not stable immediately after the start of application of the power supply voltage Vcc and the unstable negative voltage V1 cannot suppress increase of the substrate voltage $V_{BB}$. Thus, the negative voltage V1 does not have any substantial effect at the time of turn-on of the power supply and the substrate voltage $V_{BB}$ is increased according to the rise of the power supply voltage Vcc.

Now, let us consider a range of increase of the substrate voltage $V_{BB}$ at the time of turn-on of the power supply. First oi all, it is noticed that the substrate voltage $V_{BB}$ at this time is determined dependent on distribution of voltage between the power supply voltage Vcc applied to the n-well 22 and a ground level to which the n+ region 23 is connected. Accordingly, it is necessary to consider a pn junction capacitance C1 between the n-well 22 and the substrate 5 and a pn junction capacitance C2 between the substrate 5 and the n+ region 23. In addition, it is generally also necessary to take account of an influence caused by the existence of the capacitor C3 between the Vcc/2 generating circuit 3 and the substrate 5.

However, because of the high impedance of the Vcc/2 generating circuit 3, a moving amount of electric charges to the capacitor C3 of the memory cell 1 is very small immediately after the start of application of the power supply voltage Vcc even if the potential of the substrate is increased. As a result, there is actually little influence caused by the existence of the capacitor C3 and the substrate voltage $V_{BB}$ immediately after the start of application of the power supply voltage Vcc is increased due to capacitance coupling of the two pn junction capacitances C1 and C2. If this state is specifically considered with reference to an equivalent circuit shown in FIG. 2, an increase rate c of the substrate voltage $V_{BB}$ with respect to the power supply voltage Vcc is estimated as follows:

$$a = \frac{C1}{C1 + C2} \quad (1)$$

Thus, the substra $V_{BB}$ is increased with the large rate.

Consequently, the conventional CMOS DRAM involves a disadvantage that the substrate voltage $V_{BB}$ is considerably increased immediately after the start of application of the power supply voltage Vcc to cause latch-up as shown in FIGS. 3A and 3B.

A clamp circuit for preventing latch-up in an n-well CMOS device is described in IDEM, 1985, pp. 504–508 by D. Takacs et al.

SUMMARY OF THE INVENTION

In view of the prior art as described above, it is an object of the present invention to provide a dynamic RAM capable of suppressing increase of a substrate voltage immediately after a start of application of a power supply voltage to prevent latch-up.

According to the present invention, a dynamic RAM provided on a semiconductor substrate comprises: a memory cell including a capacitor for storing electric charges as information, the capacitor having a storage gate electrode to which a potential other than a ground potential is applied in normal operation of the dynamic RAM; a peripheral circuit including a CMOS circuit; and grounding means for applying the ground potential to the storage gate electrode only in a predetermined period immediately after the start of application of the power supply voltage to the dynamic RAM.

In the dynamic RAM of the present invention, the storage gate electrode is grounded only in the predetermined period from the start of application of the power supply voltage to increase a moving amount of electric charges to the capacitor of the memory cell, whereby increase of the substrate voltage immediately after the start of application of the power supply voltage can be prevented.

More specifically, since the storage gate electrode is grounded only in the predetermined period from the start of application of the power supply voltage, the dynamic RAM of the present invention makes it possible to effectively suppress increase of the substrate voltage immediately after the start of application of the power supply voltage to prevent latch-up while consumption of electric power can be reduced and a large-scale integration can be attained.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
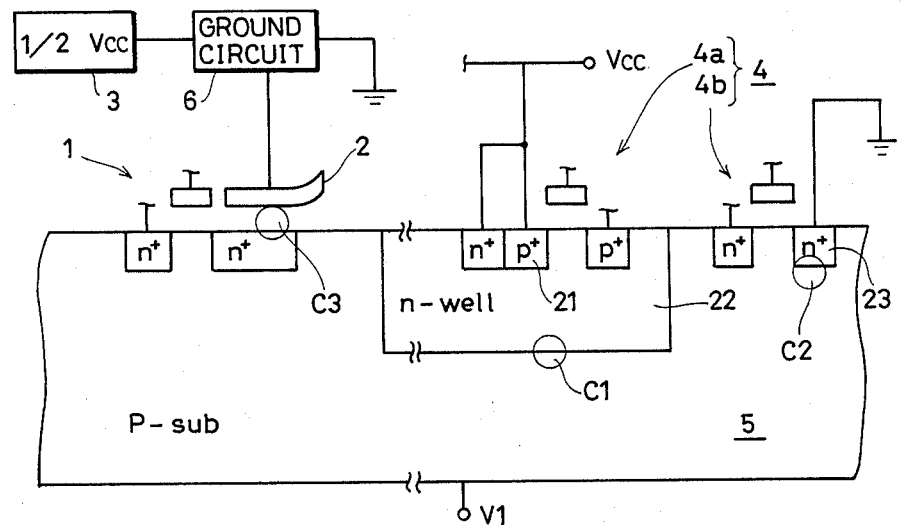
FIG. 4 is a schematic sectional view showing a portion of a CMOS DRAM of an embodiment of the present invention.
Figure 5:
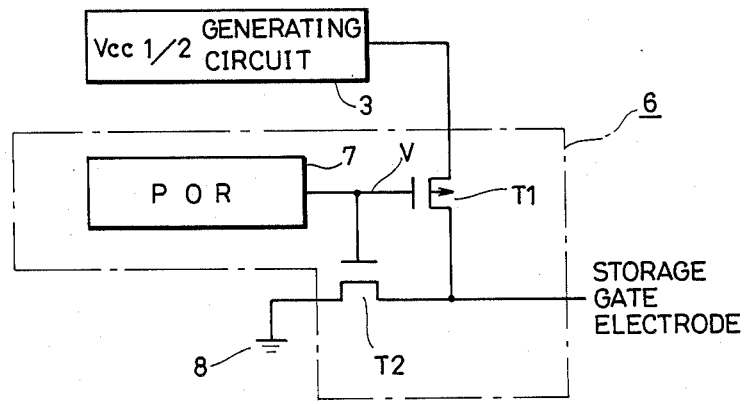
FIG. 5 is a diagram showing a ground circuit provided in the CMOS DRAM of the embodiment.

An embodiment of the present invention will be described with reference to the drawings. FIG. 4 is a schematic sectional view showing a portion of a CMOS DRAM of the embodiment of the present invention.

Figure 1:
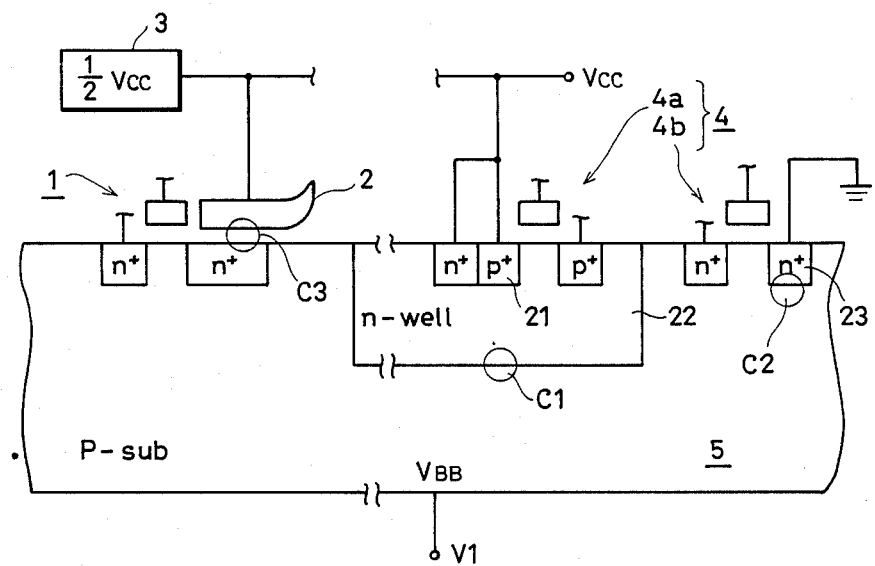
FIG. 1 is a schematic sectional view showing a portion of a conventional CMOS DRAM.
Figure 2:
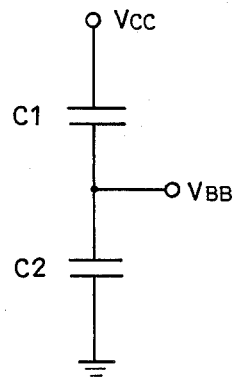
FIG. 2 is a diagram of an equivalent circuit in the conventional CMOS DRAM.
Figure 3A:
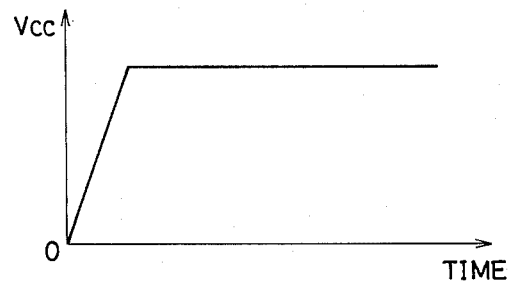
FIGS. 3A and 3B are graphs showing waveforms of a power supply voltage and a substrate voltage, respectively, in the conventional CMOS DRAM.
Figure 3B:
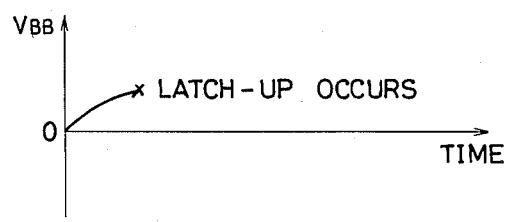

The CMOS DRAM of FIG. 4 is the same as the CMOS DRAM of FIG. 1, except that a ground circuit 6 is provided between storage gate electrode 2 and a Vcc/2 generating circuit 3 (generally, a storage gate potential supply circuit).

The ground circuit 6 comprises a power-on-reset circuit (hereinafter referred to as the POR circuit), and a pMOS transistor T1 and an nMOS transistor T2 having a common gate for receiving a power-on-reset signal V outputted from the POR circuit 7. A source of the pMOS transistor T1 is connected to the Vcc/2 generating circuit 3, while a source of the nMOS transistor T2 is connected to a ground GND8. A drain of the pMOS transistor T1 and a drain of the nMOS transistor T2 are both connected to the storage gate electrode 2. Thus, only either the pMOS transistor T1 or the nMOS transistor T2 is turned on dependent on the level of the power-on-reset signal V. In other words, the combination of those components forms switching means for selectively connecting the storage gate electrode 2 to either the Vcc/2 generating circuit 3 or the ground GND8 by applying the power-on-reset signal V as a switching signal.

Figure 6:
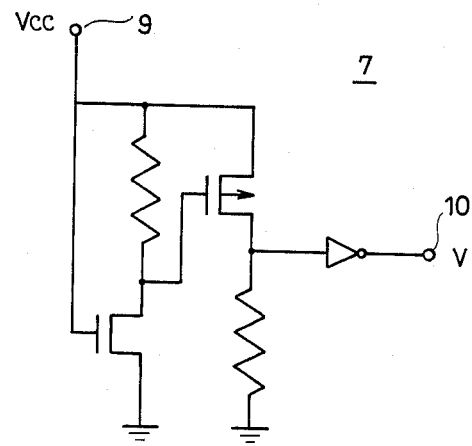
FIG. 6 is a circuit diagram showing an example of a POR (power-on-reset) circuit.
Figure 7:
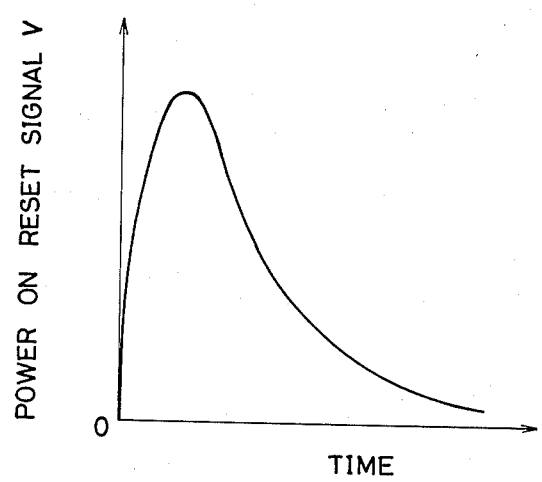
FIG. 7 is a graph showing a waveform of a power-on-reset signal from the POR circuit.

The POR circuit 7 may be the circuit shown in FIG. 6 (as disclosed in Japanese Patent Laying-Open Gazette No. 25318/1986). The circuit shown in FIG. 6 has a responsive characteristic in which the power-on-reset signal V as an output voltage from an output terminal 10 rises rapidly as shown in FIG. 7 upon receipt of the power supply voltage Vcc at an input terminal 9 and falls after a lapse of a predetermined period.

Description is now made of a change of the substrate voltage $V_{BB}$ immediately after the receipt of the power supply voltage Vcc, with regard to operation of the ground circuit 6.

When the power supply voltage Vcc is applied, the power-on-reset signal V rises to turn off the pMOS transistor T1 of the ground circuit 6 and to turn on the nMOS transistor T2 thereof. As a result, the storage gate electrode 2 is connected to the ground GND 8.

Thus, immediately after the receipt of the power supply voltage Vcc, the storage gate electrode 2 is disconnected from the high-impedance Vcc/2 generating circuit 3 and is grounded with a low impedance. In this case, a sufficient amount of electric charges can be moved to the capacitor C3 of the memory cell 1 and the substrate voltage $V_{BB}$ increases by capacitance coupling between the pn junction capacitances C1 and C2 and the capacitor C3 of the memory cell 1.

Figure 8:
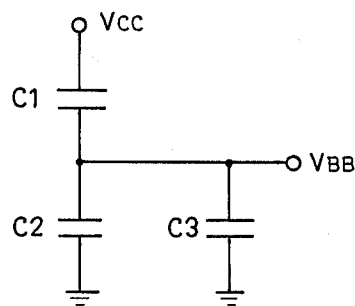
FIG. 8 is an equivalent circuit diagram in the CMOS DRAM of the embodiment.

Consequently, referring to an equivalent circuit shown in FIG. 8, if the storage gate electrode 2 is grounded, an increase rate $\beta$ of the substrate voltage $V_{BB}$ with respect to the power supply voltage Vcc is estimated as follows:

$$\beta = \frac{C1}{C1 + C2 + C3} \quad (2)$$

Let us take an example of a 1-Mbit CMOS DRAM. The value of the capacitor C3 is 40 to 50 of for one memory cell and the whole CMOS DRAM has a large capacitance of 0.04 $\mu$F to 0.05 $\mu$F. Accordingly, the increase rate $\beta$ of the substrate voltage $V_{BB}$ is very small compared with the rate in the conventional example and increase of the substrate voltage $V_{BB}$ immediately after the receipt of the power supply voltage Vcc is substantially suppressed.

When the power supply voltage Vcc becomes stable and the substrate voltage generating circuit for applying the negative voltage V1 to the substrate 5 operates stably, the power-on-reset signal V falls to cause the pMOS transistor T1 to be turned on and the nMOS transistor T2 to be turned off. As a result, the storage gate electrode 2 is connected to the Vcc/2 generating circuit 3 and the CMOS DRAM is in a normal operation state. In other words, according to this embodiment, a period for grounding the storage gate electrode 2 is set based on the waveform of the power-on-reset signal V. This period is equal to or larger than a period required until the power supply voltage Vcc becomes stable and the negative voltage V1 is stably supplied.

Thereafter, increase of the substrate voltage $V_{BB}$ is suppressed by the negative voltage V1 applied from the substrate voltage generating circuit in the same manner as in the conventional CMOS DRAM.

Figure 9A:
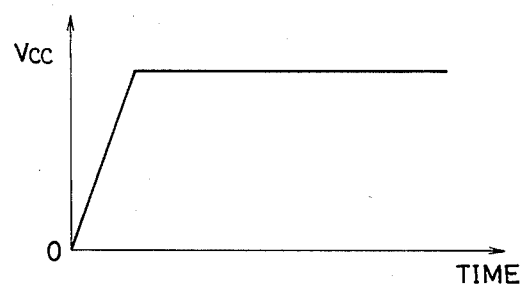
FIGS. 9A and 9B are graphs showing waveforms of a power supply voltage and a substrate voltage in the embodiment, respectively.
Figure 9B:
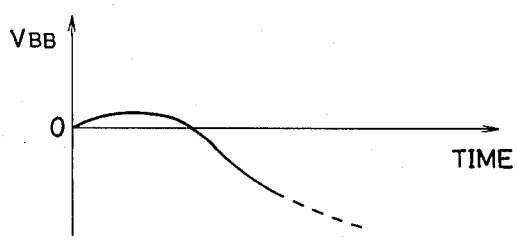

Thus, increase of the substrate voltage $V_{BB}$ is suppressed by the moving of electric charges to the capacitor C3 of the memory cell 1 immediately after the receipt of the power supply voltage Vcc and accordingly, as shown in FIGS. 9A and 9B, a substantial increase of the substrate voltage $V_{BB}$ is prevented immediately after the receipt of the power supply voltage Vcc and latch-up never occurs.

In addition, a construction for achieving reduction of power consumption and large-scale integration is adopted in the same manner as in the conventional CMOS DRAM. Particularly in this embodiment, the ground circuit 6 comprises the CMOS circuit including the transistors T1 and T2, and the well-known POR circuit 7. Accordingly, consumption of electric power in the ground circuit 6 is reduced and it is easy to form the circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory device provided on a semiconductor substrate, comprising:
   a memory cell including a capacitor for storing electric charges as information, said capacitor having a storage gate electrode to which a potential other than a ground potential is applied when said device is in normal operation;
   a peripheral circuit including a CMOS circuit; and
   grounding means responsive to the voltage appearing at a power supply connection, and including switching means for applying the ground potential to said storage gate electrode only in a predetermined period immediately after a start of application of a power supply voltage to said device.

2. A dynamics random access memory device in accordance with claim 1, wherein
   said grounding means includes switching means for selectively applying either the potential other than the ground potential or the ground potential to said storage gate electrode responsive to a power-on-reset signal.

3. A method for preventing latch-up of a dynamic random access memory having a memory cell including a capacitor for storing electric charges as information, said capacitor having a storage gate electrode to which a potential other than a ground potential is applied when said device is in normal operation and a peripheral circuit including a CMOS circuit comprising the steps of
   connecting a ground potential to said storage gate electrode for a predetermined period immediately after a start of application of a power supply voltage to said dynamic random access memory device and
   thereafter connecting said potential other than a ground potential to said storage gate electrode of said dynamic random access memory device.

4. A dynamic random access memory device including a plurality of MOS transistors of a second channel type formed on a major surface of a semiconductor substrate of a first conductivity type and a plurality of MOS transistors of a first channel type formed on a well of a second conductivity type provided on said major surface, comprising:
   a memory cell including a capacitor connected electrically with one of said MOS transistors of the second channel type, said capacitor including a storage gate electrode formed on said major surface with an intervening insulator;
   a voltage generating means formed on said major surface for generating voltage output between a power supply voltage and a ground potential; and
   grounding means for applying the ground potential to said storage gate electrode only in a predetermined period immediately after a start of application of said power supply voltage and for applying the voltage output of said voltage generating means to said storage gate electrode immediately after said predetermined period;
   wherein said grounding means is formed on said semiconductor substrate and comprises:
   power-on-reset means for generating a power-on-reset signal which is higher than a predetermined potential in the predetermined period immediately after the start of application of said power supply voltage and lower than a predetermined potential thereafter;
   a first switching means connected to said power-on-reset means and also connected between said ground potential and said storage gate electrode, for applying said ground potential to said storage gate electrode when receiving said power-on-reset signal which is higher than said predetermined potential; and
   a second switching means connected to said power-on-reset means and also connected between said voltage generating means and said storage electrode, for applying the output of said voltage generating means to said storage electrode when receiving said power-on-reset signal which is lower than said predetermined potential.

5. A dynamic random access memory device in accordance with claim 4, wherein
   said first switching means comprises one of said MOS transistors of the second channel type, and
   said second switching means comprises one of said MOS transistors of the first channel type.

* * * * *